United States Patent [19]
De et al.

[11] Patent Number: 5,903,578
[45] Date of Patent: May 11, 1999

[54] TEST SHELLS FOR PROTECTING PROPRIETARY INFORMATION IN ASIC CORES

[75] Inventors: Kaushik De, San Jose; Siva Venkatraman; Arun Gunda, both of Sunnyvale, all of Calif.

[73] Assignee: LSI Logic Corporation, Milpitas, Calif.

[21] Appl. No.: 08/611,325

[22] Filed: Mar. 8, 1996

[51] Int. Cl.[6] .................................................. G01R 31/28
[52] U.S. Cl. .................................. 371/22.31; 395/183.06
[58] Field of Search ........................... 371/22.3, 22.1,
371/22.5, 21.2, 22.31, 22.32, 22.33, 22.34,
27.1, 27.5; 324/158.1; 364/489, 481, 488;
395/490, 183.06, 183.07, 183.13, 183.19

[56] References Cited

U.S. PATENT DOCUMENTS

| | | | |
|---|---|---|---|
| 5,291,495 | 3/1994 | Udell, Jr. ................................ | 371/22.3 |
| 5,331,570 | 7/1994 | Bershteyn .............................. | 371/22.1 |
| 5,502,731 | 3/1996 | Meltzer ................................... | 371/22.3 |
| 5,519,713 | 5/1996 | Baeg et al. ............................. | 371/22.1 |
| 5,528,604 | 6/1996 | El-Maleh et al. ........................ | 371/27 |
| 5,534,774 | 7/1996 | Moore et al. ......................... | 324/158.1 |
| 5,544,173 | 8/1996 | Meltzer .................................. | 371/22.3 |

OTHER PUBLICATIONS

International Test Conference 1991, Paper 14–2, Hierarchical Test Program Development for Scan Testable Circuits, pp. 375–384.

*Primary Examiner*—Robert W. Beausoliel, Jr.
*Assistant Examiner*—Nadeem Iqbal
*Attorney, Agent, or Firm*—Oppenheimer Wolff & Donnelly LLP

[57] ABSTRACT

A reduced netlist representing only partial netlist information for a logic block such as an ASIC embedded core is generated, such that proprietary information contained within the netlist can be kept confidential. The core is conceptually divided into a first section that can be completely tested using only a serial scan port, and a second section that can be tested in isolation from the first section using both primary inputs to the core as well as scan inputs. Netlist information for the first section is removed from the netlist, and the customer is supplied with serial scan test vectors that test the first section. Additionally, a multiplexing circuit selects either a serial scan chain for the entire logic block, or a scan chain that does not include scan cells within the first section of the logic bloc.

8 Claims, 9 Drawing Sheets

ASIC

TEST SHELLS FOR PROTECTING PROPRIETARY INFORMATION IN ASIC CORES

BACKGROUND OF THE INVENTION

1. Field of the Invention

The present invention relates to the field of integrated circuit testing. More particularly, the present invention relates to the field of test shells for protecting proprietary information contained within ASIC cores.

2. Description of the Related Art

Application specific integrated circuits (ASICs) are full custom or semicustom microcircuits. Typically, the ASIC vendor supplies to the customer (ASIC designer) an ASIC library containing small scale functional blocks (primitives) as well as large scale functional blocks (cores). The customer then designs an ASIC to its own specification using these primitives and cores as building blocks. Depending on the software tools used by the customer, the customer may either work with these modules as individual building blocks using schematic capture techniques, or the customer may specify the circuit using a descriptive language such as VHDL or Verilog. In the latter case, a synthesis tool receives the descriptive language input, and synthesizes a circuit netlist that will implement the functionality specified by the customer. ASICs may also be designed using a combination of schematic capture and synthesis methods.

Cores may range in size up to extremely large functional blocks such as a mini Reduced Instruction Set Computer (RISC) processor. As integration levels rise, customers demand cores with greater functionality with which to implement their designs. The detailed design of large cores is usually considered proprietary information. Because it is desirable to maintain the detailed design of the core as proprietary information, it is desirable that the customer be given only the functional description and input/output timing diagrams of the cores so that he can use them in his design, and not be given the detailed design of the cores. Accordingly, the customer is supplied with a synthesis shell, which is a high level description of the implementation of the core, containing enough information for optimization to the synthesis tool regarding the core. The customer is also provided with a timing shell, which contains the input/output timing specifications of the core. Beyond these two shells, the customer does not need to know the detailed implementation of the core. Accordingly, the customer is not provided with internal design details.

After the ASIC has been designed and manufactured, the chip must be tested for any manufacturing defects. This involves first simulating the ASIC using a variety of input test patterns, and recording the simulation output results which represent the expected outputs of a properly functioning ASIC. The input test patterns are then applied to the actual ASIC. The actual outputs are compared to the expected outputs. Deviations from the expected outputs indicate that the ASIC has a manufacturing defect.

Logic buried deep within the ASIC may require an enormous number of test patterns to test. To facilitate testing, scan cells are added to the ASIC at strategic locations. Scan cells are points at which logic values may be forced into the ASIC (scan writable gates) and/or observed within the ASIC (scan readable gates). Scan cells normally take the form of flip-flops which may be forced to the desired logic level, and which may be read from outside the ASIC. In general, existing flip-flops are converted into scan flip-flops by adding some additional logic gates. For example, scan cells enable the tester to preset a counter within the ASIC to a particular count, and to verify that combinatorial logic derived from the counter outputs is working properly. Strategic placement of scan cells within an ASIC allows the number of test patterns required to fully test an ASIC to be drastically reduced. This is important primarily because the computer simulations necessary to produce the test patterns and expected resulting outputs require a great deal of computer resources. Without scan cell techniques, simulation times to produce test patterns that adequately test an ASIC would be impractically long. Furthermore, without scan cells some gates within an ASIC may be simply not testable. However, using scan cells it is possible to develop test patterns that will detect 99% or more of possible gate failures using a set of test patterns that is not impractically long. The fault coverage obtained is the percentage of possible gate failures that will be detected by a given set of test patterns. Scan cells are normally connected in long chains, allowing all of the scan cells to be written to or read from using only a few dedicated test I/O lines on the ASIC.

ASIC designs using embedded cores present a challenge to test. FIG. 1 illustrates the use of embedded core logic within an ASIC 100. Core 102 is a high level functional block designed by the ASIC vendor, and available to the customer as a library component. Core 102 receives inputs from some logic 104 and produces outputs used by some other logic 106. Embedded cores typically are supplied by the vendor along with a set of test patterns which, if applied in isolation, will produce 99% fault coverage. However, these patterns cannot usually be applied to the embedded core in isolation, because the core is buried inside the ASIC with no direct access to the core's primary inputs and primary outputs. Hence it is not possible to apply the supplied set of test patterns to the core in isolation unless some mechanism is supplied for accessing the core.

Among the isolation schemes that have been proposed are multiplexed isolation, boundary scan wrapped around the core, or test protocol expansion used for macro testing. All of these proposed techniques result in area and performance overhead, which may make these technique unacceptable for many applications.

A second possible type of approach is to generate new test vectors which will be applied at the ASIC level. Test pattern generation software is well known in the art, and is usually provided by third party vendors. The input to a test pattern generation program is typically a flattened ASIC netlist. The flattened netlist describes the complete ASIC in terms of primitives such as AND and OR gates, and their functional interconnections. The netlist is described as flattened because the cores, which are hierarchical functional blocks, have been reduced to their constituent primitives and interconnections. Using the flattened netlist, the test pattern generation software is able to generate test patterns that will test the ASIC with an extremely high percentage of fault coverage.

The problem with which the present invention is concerned is that supplying a flattened netlist to the customer from which the third party's test pattern generator software can generate test patterns to test the entire ASIC, conflicts with the goal of keeping the detailed design of cores confidential. The flattened netlist for the core comprises much of the proprietary design details that the ASIC vendor desires to keep confidential.

SUMMARY OF THE INVENTION

Accordingly, it is an object of the present invention to provide a method of generating ASIC test patterns, while maintaining aspects of a core netlist confidential.

It is a further object of this invention to provide only as much information about a core netlist as is necessary for software to generate test patterns to test the ASIC, while maintaining certain design implementation details of ASIC cores confidential.

It is a further object of the present invention to provide a test shell for an ASIC core.

According to the present invention, a method and circuit are provided whereby a test shell may be created for any ASIC core. The test shell is a novel construct. It contains only the minimal amount of detailed implementation information necessary for a test pattern generator to generate test vectors that will thoroughly test an ASIC.

To understand the concept of a test shell introduced herein, it is helpful to analogize to the synthesis shell and the timing shell previously discussed. The synthesis shell for a core included only enough information for optimal operation of the circuit synthesis tool. The timing shell contained only the timing information necessary to allow surrounding circuitry to load information into the "outer layer" of the core and receive the resulting outputs. Similarly, the test shell of the present invention contains only the minimal amount of information about the detailed implementation of a core necessary to allow a test pattern generator to generate patterns that, in combination with test vectors supplied by the vendor, will thoroughly test the gates within the core as well as the ASIC containing the core.

An unreduced core netlist represents the detailed implementation of an ASIC core. An object of the present invention is to reduce that netlist to the minimum necessary for full functional testing.

According to the present invention, gates are identified that may be completely isolated from the primary (functional) inputs and the primary (functional) outputs by scan cells, and which may also be isolated from gates affected by the primary inputs by scan cells. Stated in a different way, gates are removed from the netlist that are:

a) not in the output cone of the primary inputs (OCPI), b) not in the input cone of the primary outputs (ICPO), and c) not in the input cone of any gates that are in the OCPI.

Gates that meet the above conditions may be removed because they exhibit the characteristics that they:

1) may be completely tested by using only scan operations without the need to toggle any primary inputs, and 2) have no effect on the rest of the core and ASIC during scan operations.

The ASIC vendor will supply a set of scan vectors that will completely test these gates in isolation from any primary inputs or primary outputs. Because these gates have no effect on the rest of the core and ASIC during scan operations, the rest of the core may be tested using ASIC I/O's and scan cells without any knowledge of the functionality or implementation of these gates.

Stated generally, the present invention involves the steps of identifying a first logic group comprising gates within a digital logic block that may be tested using a test port, identifying a second logic group comprising gates that may be tested in isolation from the first logic group, and generating a reduced netlist, the reduced netlist containing netlist information for the second logic group, the netlist containing less than complete netlist information for the first logic group.

In a second aspect of the present invention, a method is provided for connecting scan cells within a logic block removed from the netlist, to the scan chain within the rest of the ASIC. This method avoids revealing to the test pattern generator the existence of those scan cells. According to the method, a first scan chain includes all of the scan cells within the ASIC, including those scan cells that are within the removed logic block. A second chain includes only those scan cells that are not within the removed logic. A command bit selects either the first or the second chain to be connected to the scan output. When the second chain is selected and the data contained within the scan chain read out, knowledge of the existence of scan cells within the removed logic block is not required to determine the expected scan chain output. Because knowledge of the scan cells within the removed logic block is not required, additional information about the removed logic block is kept confidential.

When the first chain is selected, the information within the removed logic block will also be read out, and knowledge of all scan cells within the ASIC will accordingly be required. However, the portion of the test pattern program that exercises the removed logic and reads the information out of the scan cells within the first chain is the portion that is supplied by the ASIC vendor. Therefore, no information about the scan cells within the removed logic block needs to be supplied to the customer or the test pattern generation program being used by the customer.

DETAILED DESCRIPTION OF THE INVENTION

Figure 1:
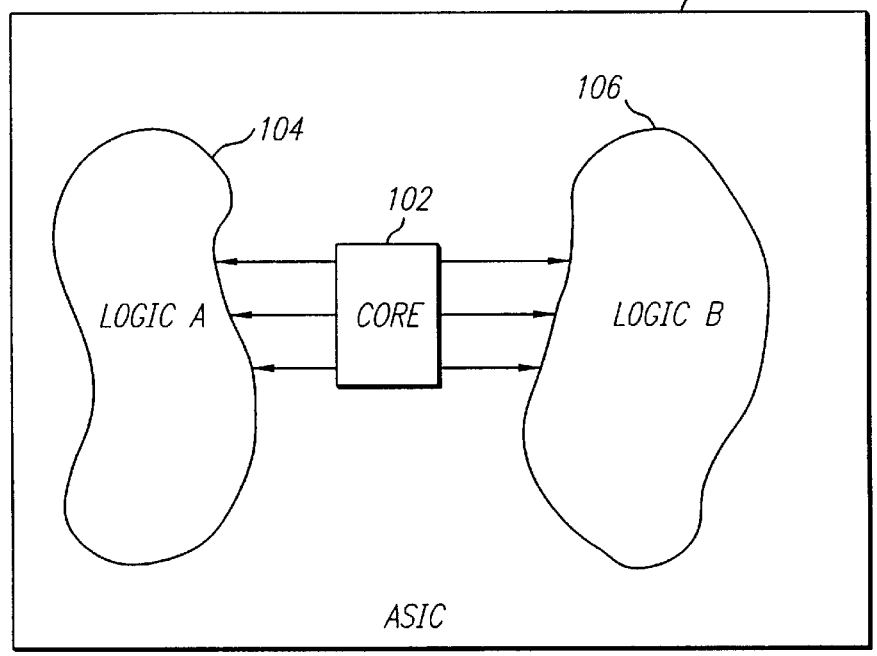
FIG. 1 is an example of ASIC logic including an embedded core.

The novel construct of a test shell introduced herein is similar to a timing shell. It reveals only as much of the core as is necessary to develop test vectors, while protecting as much of the intellectual property or proprietary information contained within the core as is possible.

A test shell includes a partial or reduced netlist to be provided along with the core. The partial netlist is sufficient to allow a test pattern generator to generate test patterns to test part of the core and the rest of the ASIC that is not within the core. The netlist information representing the remaining (protected) portion of the core is not supplied to the customer. As a result, the proprietary information contained therein is protected since it is very difficult or impossible to reverse engineer the complete core from merely a partial netlist. The vendor supplies a set of test vectors to test that part of the core logic whose implementation details are not revealed to the customer. These test vectors exercise the protected portion of the core through the scan chain within the core. The results of the testing can be read at the scan port output. Because the protected portion can be completely tested using only the scan port, access to the core primary inputs and primary outputs is not necessary to test the protected portion.

Typically, a single test port is used that comprises an input line, an output line, and a control line, for a total of three I/O pins. This test port connects to a single scan chain running through the entire core. Other port configurations are possible, including ports having a different number of pins with correspondingly different functions, as well as multiple test ports and multiple scan chains. It is to be understood that references herein to a test port encompass such other alternative arrangements.

To test the remainder of the ASIC, including the unprotected portion of the core, the customer will be given a netlist that includes netlist information for the unprotected portion of the core. For this portion of the testing, scan control allows the unprotected portion to be logically isolated from the protected portion. In this logically isolated state, the protected circuitry has no effect on the unprotected circuitry. The test pattern generator can therefore determine the expected response from the unprotected portion, and fully test that portion along with the rest of the ASIC. Combined testing using the test vectors generated by the customer which tests the unprotected portion, and the test vectors generated by the vendor that tests the protected portion, allows the entire ASIC including the core to be substantially fully tested. As with any automatic test generation, a few gates may remain untested or untestable. A fault coverage of 99% is usually considered acceptable.

According to the present invention, given a particular core, structural analysis is performed on the core to determine which gates can be removed from the core netlist before the netlist is supplied to the customer. It should be noted that no gates are ever removed from the actual implementation of the core in hardware. Rather, gates and their interconnections are being removed from the netlist or other description of the core that is supplied to the customer. The concept of a test shell will be further developed with reference to an example core circuit shown in FIG. 2.

Figure 2:
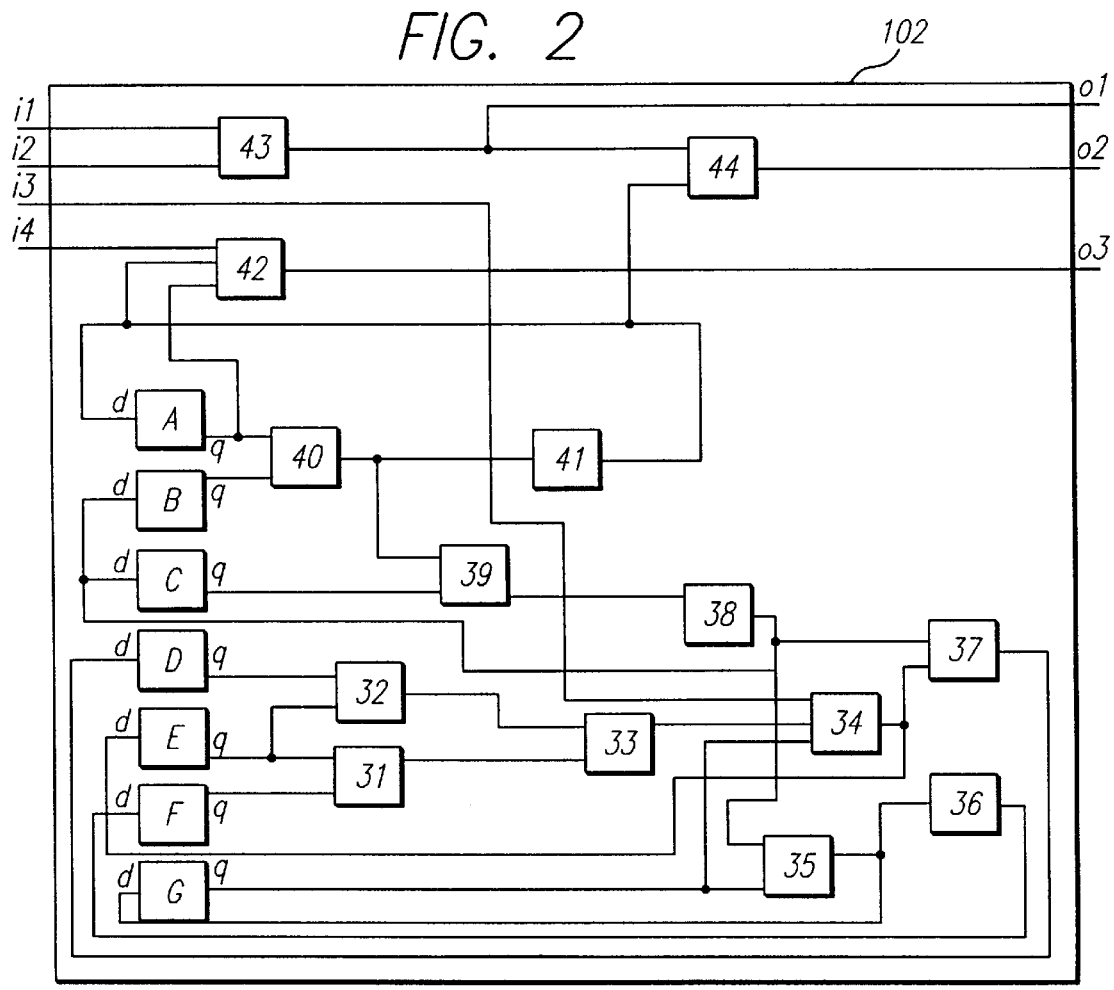
FIG. 2 is an example of logic within a core.

In FIG. 2, the example core circuit 102 has 4 primary inputs (i1, i2, i3, and i4) and 3 primary outputs (o1, o2, and o3). The scan flip-flops within the circuit are labelled A through G. Combinatorial gates and non-scan flip-flops are given numerical reference designators 31 through 44. Because only structural analysis will be performed, the type of combinatorial gates (i.e., AND, OR, etc.) does not affect the analysis.

Scan flip-flops are capable of behaving like inputs and outputs when the scan cells are activated via scan control. For these reasons, they are referred to as pseudo-primary inputs and pseudo-primary outputs. When the scan cells are activated, any traversal from the primary inputs to the primary outputs will stop whenever it reaches a scan flip-flop. If any flip-flop is not a scan flip-flop, then for the present analysis it will be grouped with the combinatorial gates. Traversal will not be considered to stop at non-scan flip-flops.

Figure 3:
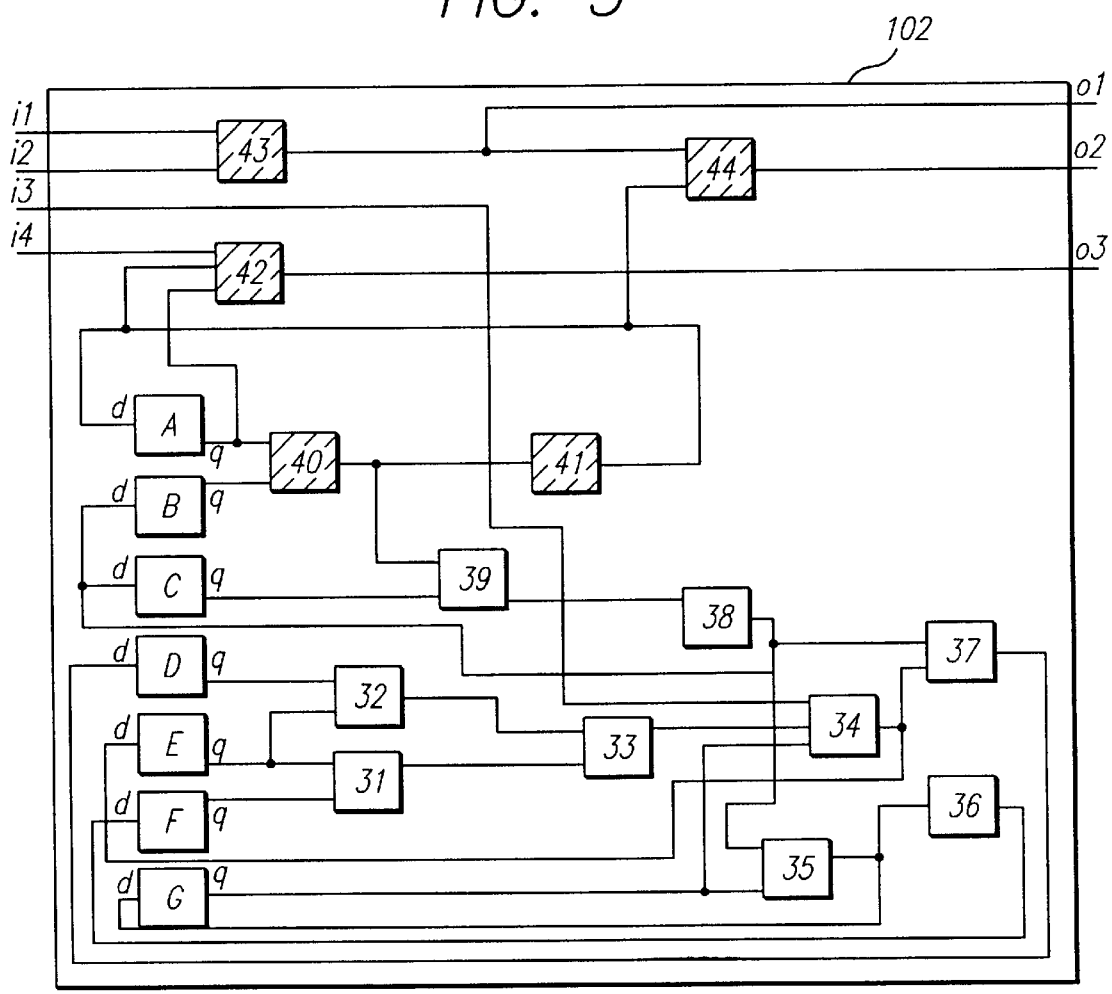
FIG. 3 illustrates the input cone of the primary outputs for the core of FIG. 2.

First, we perform backward traversal from the primary outputs (o1 to o3) and mark all gates which have uninterrupted paths to any primary outputs. These gates (gates 40, 41, 42, 43, and 44) are shown in FIG. 3 using diagonal striping. These gates are said to be within the input cone of the primary outputs (ICPO). Signals propagate from these gates to primary outputs uninterrupted by scan flip-flops. The inputs and presents states of only these gates is required to predict all of the primary outputs when the scan cells are enabled. Information regarding other gates is not required. If the values at the primary inputs (i1 to i4) and the pseudo-primary inputs (A to G) are known, then the values at the primary outputs (o1 to o3) can be completely calculated.

Figure 4:
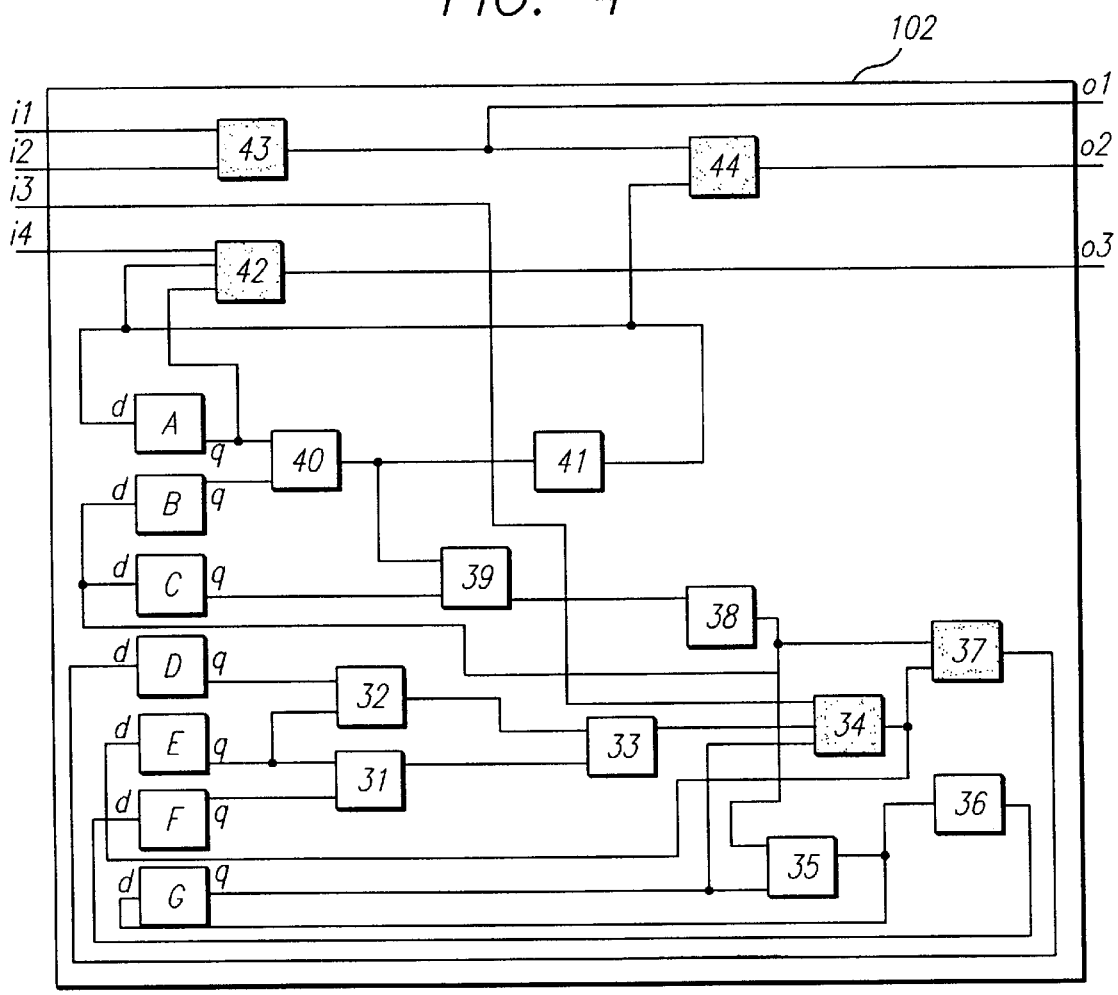
FIG. 4 illustrates the output cone of the primary inputs for the core of FIG. 2.

Referring now to FIG. 4, next we perform forward traversal from the primary inputs (i1 to i4) to determine the gates that are within the output cone of the primary inputs (OCPI). These gates (34, 37, 42, 43, and 44) are denoted by a stippling pattern. Signals propagate from the primary inputs to these gates uninterrupted by scan flip-flops. Hence, it is not possible to test these gates without toggling or at least controlling the primary inputs.

We observe that knowledge of the stippled gates is not by itself sufficient to predict the states of gates that are affected by the primary inputs. For example, gate 37 is within the output cone of the primary inputs. However, it is affected by other gates as well, namely, gates 38, 39, and 40. To propagate a fault at gate 34 through gate 37, the value of gate 38 must be set at a non-controlling value (1 if gate 37 is an AND gate, 0 if an OR gate, etc.). Hence, the functionality of gate 38 must be known to test gates 34 and 37. The input to gate 38 is determined by gate 39 and gate 40.

Figure 5:
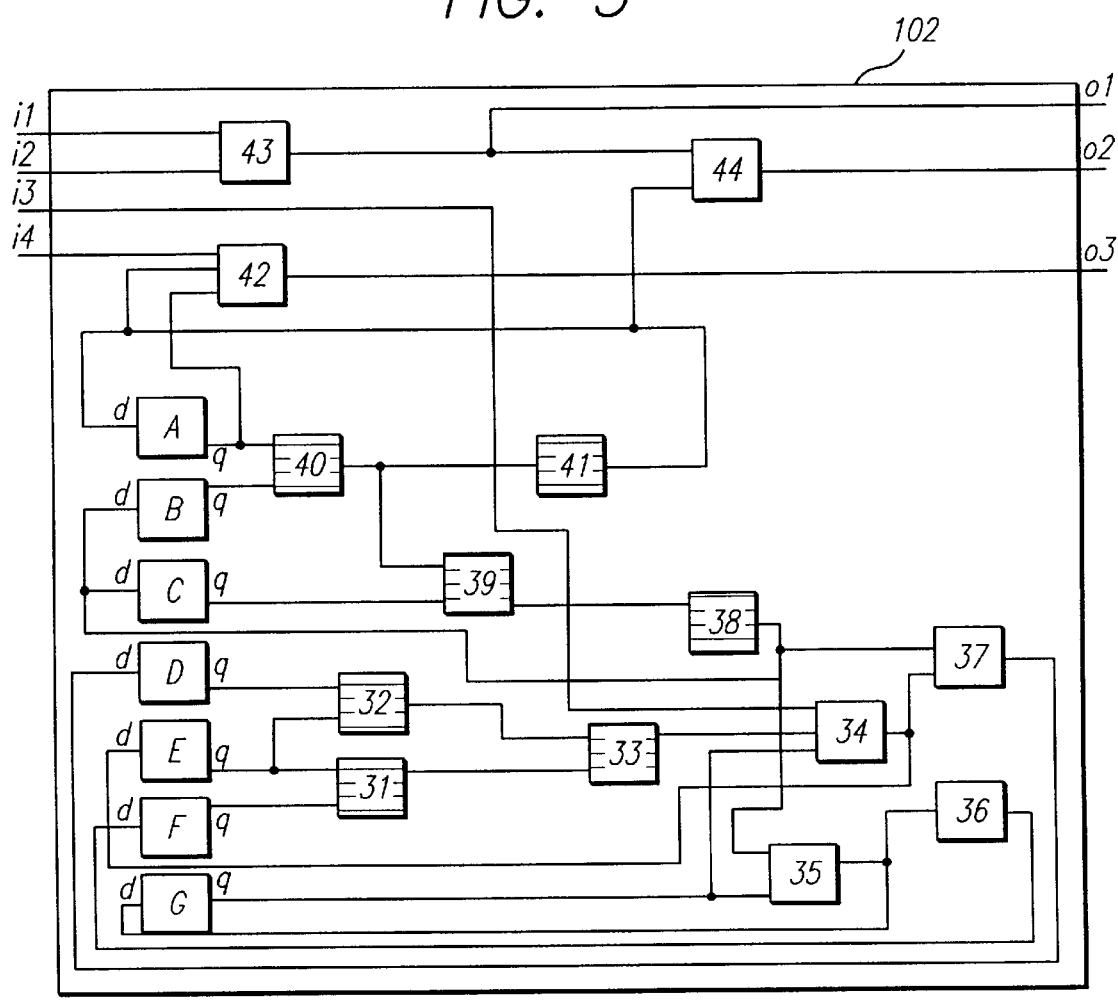
FIG. 5 illustrates the side inputs for the core of FIG. 2.
Figure 6:
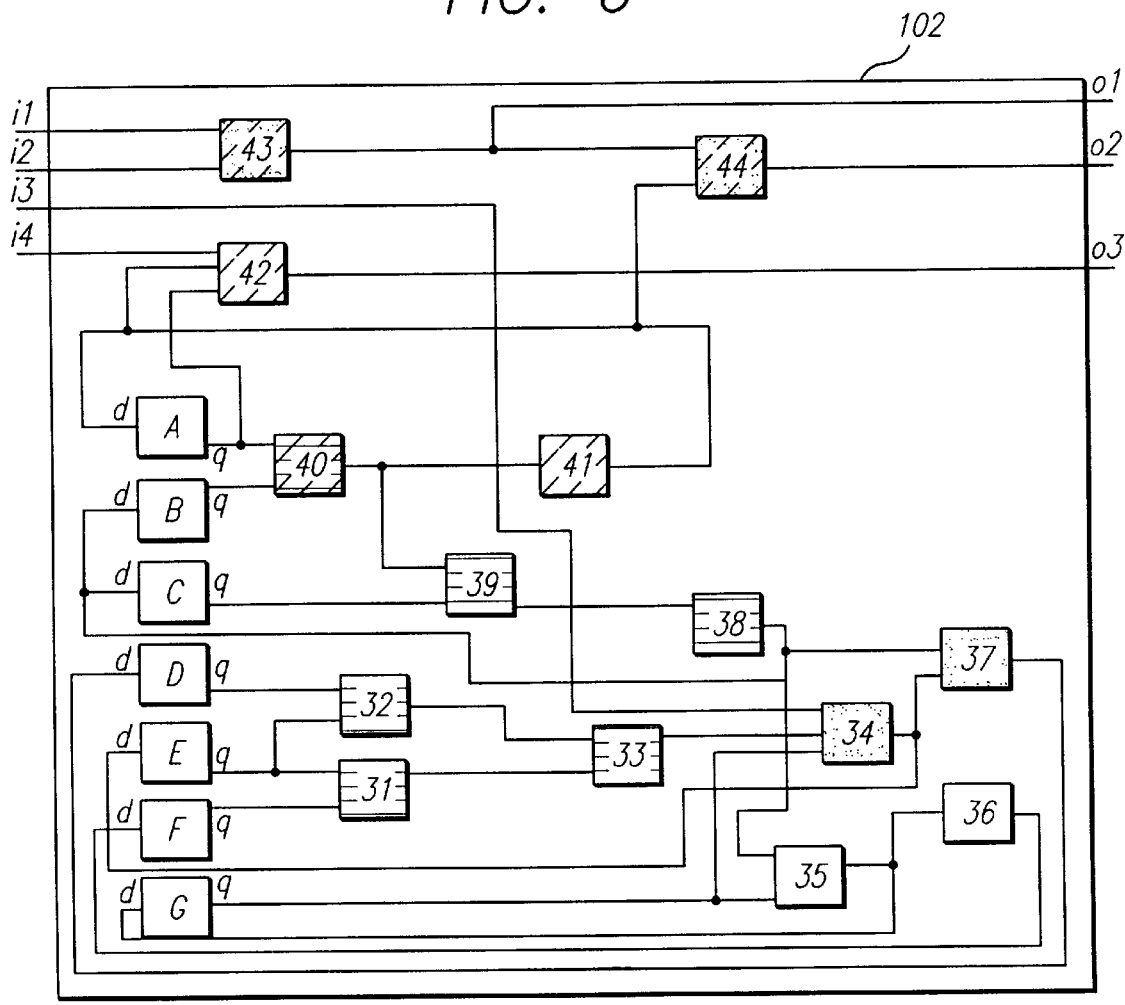
FIG. 6 illustrates the complete classification of gates within the core of FIG. 2.
Figure 6:
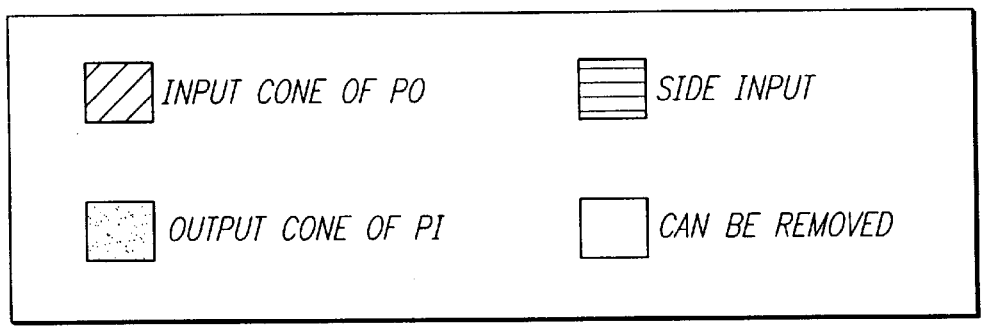
Figure 7:
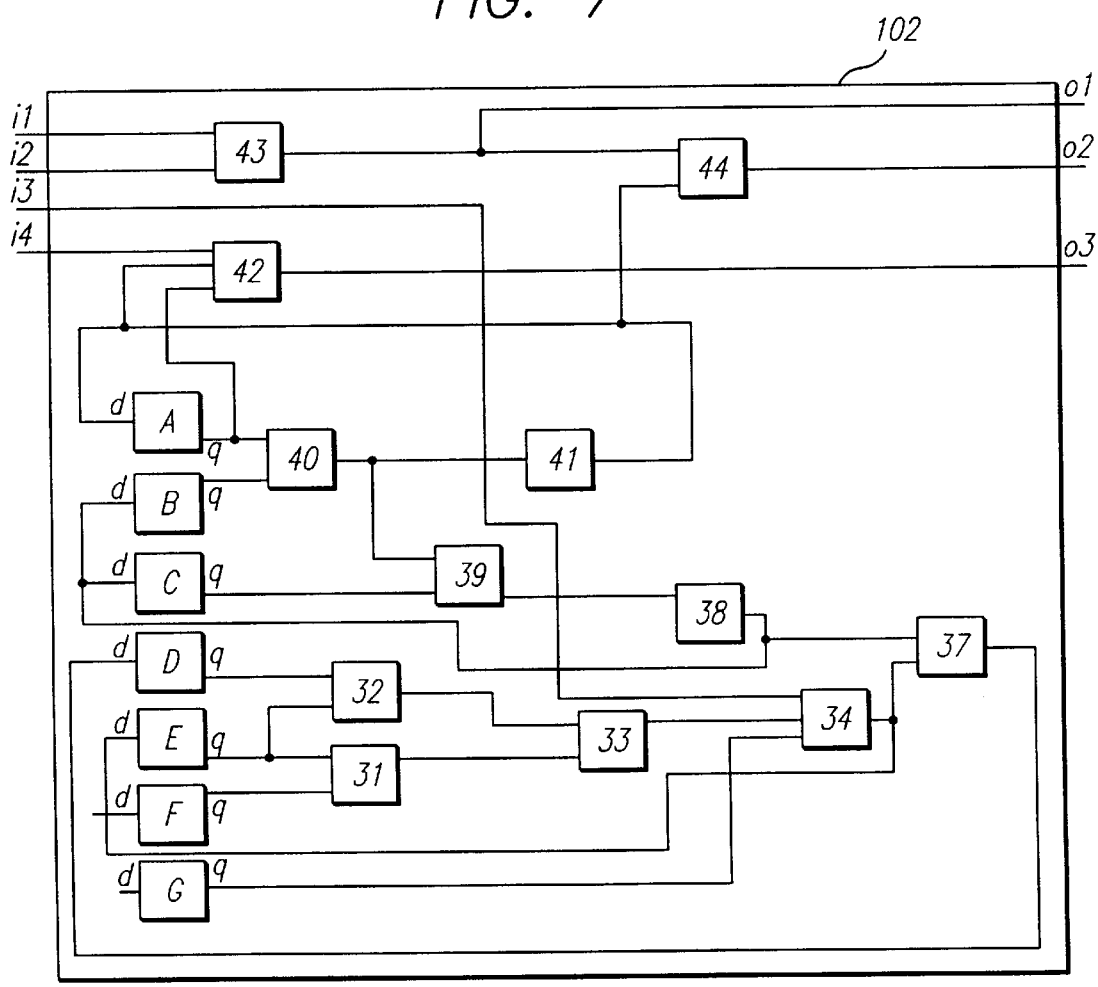
FIG. 7 is a model of the core of FIG. 2 with gates removed according to the method of the present invention.

Generalizing from the example, to test gates that are within the output cone of the primary inputs, one must know not only the functionality of those output cone gates, but one must also know the functionality of gates that are within the input cone of the output cone of the primary inputs. This latter group of gates will be termed the side input gates. The side input gates within the example (31, 32, 33, 38, 39, 40) are shown in FIG. 5 with horizontal striping. The complete diagram marking is shown in FIG. 6.

It will be observed at this point that there is one class of gates remaining. This is the class of gates (gates 35 and 36) that are not marked. The characteristics of this class are that the gates within this class (1) do not require any primary inputs to test (only gates within the output cone of the primary inputs, and side input gates require primary inputs to test), and (2) do not require observing primary outputs to test (are not within the input cone of the primary outputs). Stated another way, these gates may be completely tested using only the scan cells. When the scan cells are activated, these gates are logically isolated from the rest of the core. They do not affect the rest of the core, and the rest of the core does not affect them.

Scan cells are usually connected in series in a single serial scan chain, accessible via a serial scan port. Thus, gates 35 and 36 can be completely tested via the serial scan port. The ASIC vendor can generate test vectors to be applied via the test port that will fully test these gates. Furthermore, testing of the rest of the core can be conducted independently of them. For this reason, the test vector generator does not need any information about these gates to generate test vectors that will fully test the rest of the core. All information concerning these gates can be removed from the netlist. They are said to be removable gates.

The core has thus been conceptually divided into two portions. During normal operating mode, the two sections operate together. The first portion comprises removable gates that can be completely isolated in test mode from the rest of the core and tested via a serial scan port, using test vectors generated by the ASIC vendor. The second portion can be completely isolated from the removable gates, and tested without knowing the functionality or any implementation details of the removed logic. The customer will generate test vectors for testing this second portion. These test vectors will test the ASIC using the primary inputs and primary outputs as well as the scan test port. Combining the test vectors generated by the customer with the test vectors supplied by the vendor, the ASIC can be fully tested by the customer, without revealing to the customer certain implementation details of the core.

To summarize, the method of reducing the netlist involves the steps of identifying those gates that are (a) not in the OCPI, (b) not in the ICPO, and (c) not in the input cone of any gates that are in the OCPI. The method further involves eliminating all of those gates so identified from the unreduced core netlist.

Figure 8:
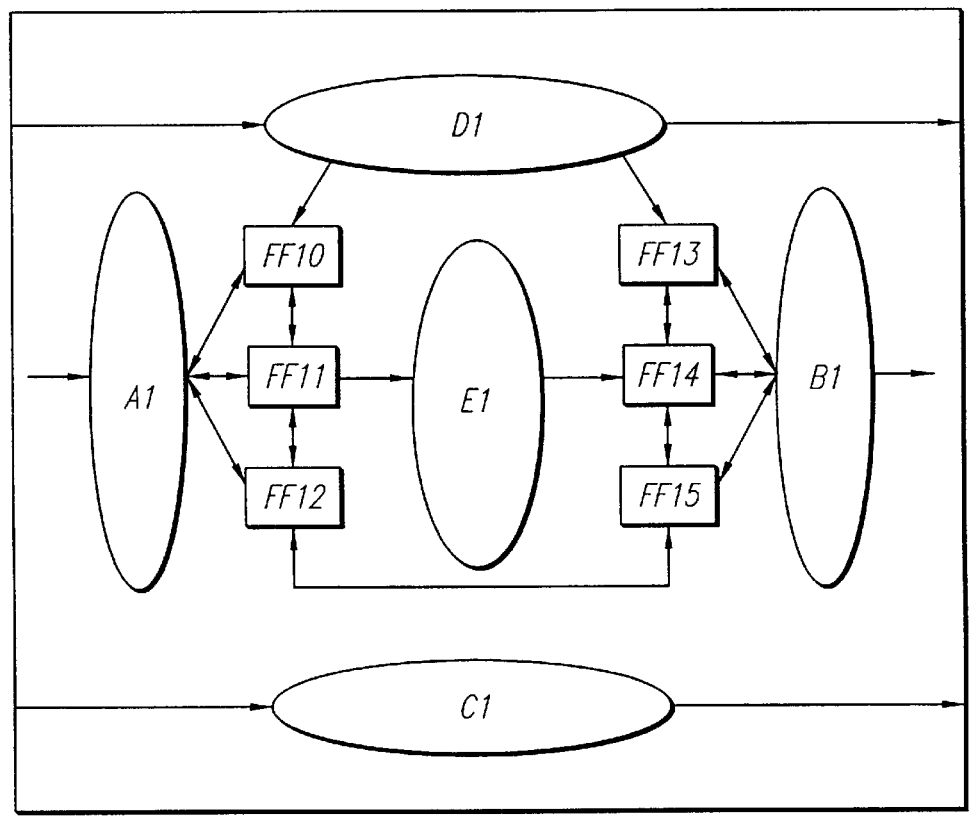
FIG. 8 is a conceptual classification of various gates within a core.

A generalized structural description of a partial netlist is shown in FIG. 8. This figure represents the conceptual division of the ASIC core into its constituent logic groups for purposes of generating the test shell. The square boxes FF10–FF15 represent scan flip-flops which act as pseudo-primary inputs and pseudo-primary outputs. Logic block A1 is controlled by primary inputs to the core, and feeds only the scan flip-flops. Netlist information for logic block A1 is necessary for fault propagation. Logic block BE can be completely controlled by scan flip-flops and feeds primary outputs of the core. Netlist information for logic block B1 is necessary for the justification process during test generation. Logic block C1 is controlled by primary inputs to the core and directly feeds the primary outputs of the core. Netlist information for logic block C1 will also be preserved in the test shell partial netlist. Logic block D1 is a combination of all of the above cases and will also be retained in the partial netlist.

Logic block E1 is completely surrounded by the scan chain. It can therefore be completely tested using only the scan chain without needing to control or toggle the primary inputs. Logic block E1 can be deleted from the core netlist without affecting the test vector generator's ability to generate vectors that will test the remaining portion of the ASIC. The partial netlist for the core will contain logic blocks A1, B1, C1, and D1. It will not contain E1. The test patterns which test logic block E1 through the scan chain will be generated by the vendor and supplied to the customer. Serial vectors that test logic block E1 will be input through the scan chain, and the results will also be read out through the scan chain. It does not matter that the scan chain for the core depicted in FIG. 8 is concatenated with the scan chains for other cores, or any other scan cells within the ASIC.

Figure 9:
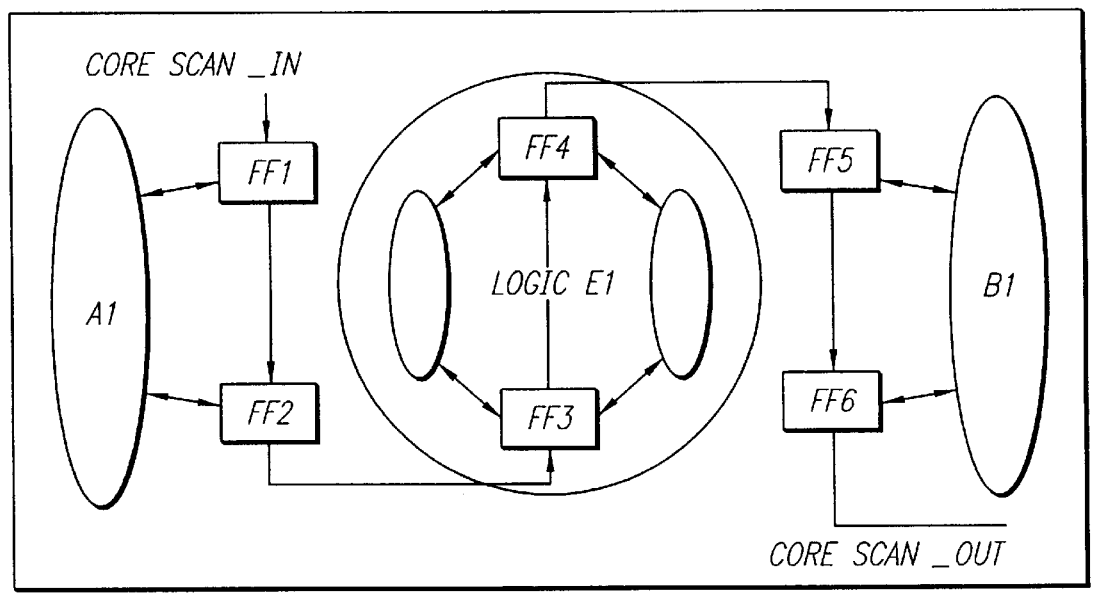
FIG. 9 illustrates a traditional scan chain of a core, including that portion of the scan chain that passes through removable logic.

A further aspect of the present invention involves the treatment of scan chains. It has already been determined that the netlist information for block E1 in FIG. 8 will not be given to the customer. When logic block E1 contains scan flip-flips such as FF4 and FF5 as depicted in FIG. 9, and those scan flip-flops are connected to the same scan chain that runs throughout the entire ASIC as is the normal practice to reduce ASIC I/O pin requirements, the contents of those flip-flops will be read out whenever the tester reads the scan chain. The test vector generator must therefore be informed, at a minimum, how many scan cells are contained within removed logic block E1. The problem with revealing this information is that it is desirable to keep confidential even the number of scan flip-flops within logic block E1. One possible solution is to delete the scan cells along with the rest of the removed logic from the netlist and allow the customer to generate test vectors as normal. Before these test vectors are applied to the hardware, the vendor edits this file to insert a number of X's ("don't cares") into the expected output vector file, the number of X's being equal to the number of scan cells removed. One drawback to this solution is that such post-processing editing of the expected test vector file can become burdensome, particularly when an ASIC contains multiple instances of multiple cores.

Figure 10:
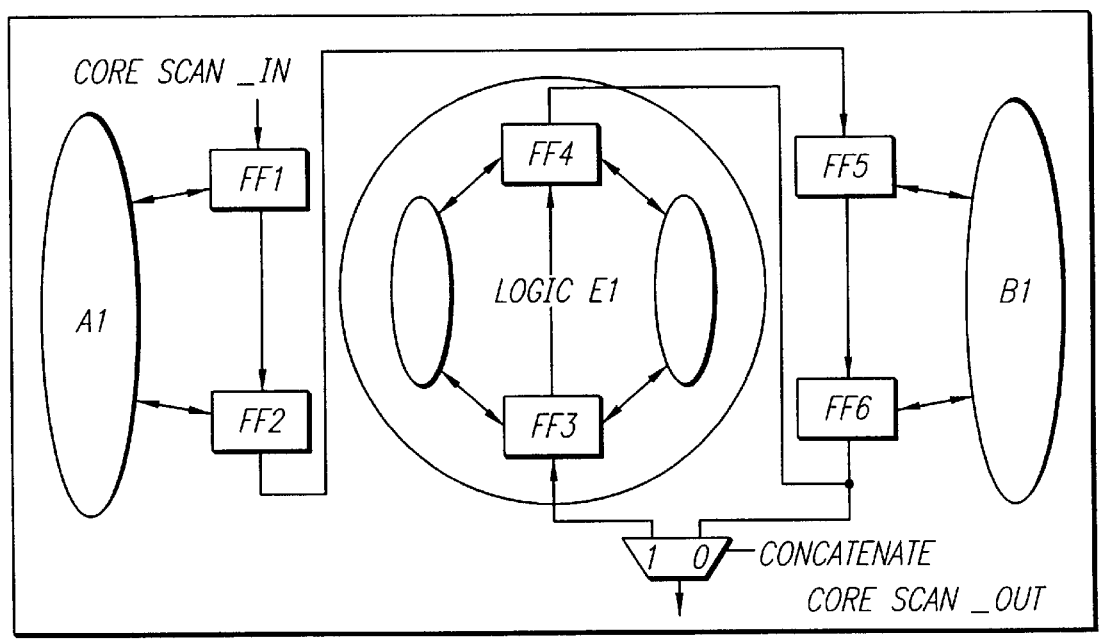
FIG. 10 illustrates a scan chain concatenation selection technique according to the present invention.

A second and preferred solution is shown in FIG. 10. Form a first scan chain comprising all the scan cells (FF1–FF6) as normal. This first chain includes the scan cells (FF3 and FF4) within the removed block E1 concatenated with the other scan cells. Form also a second scan chain comprising only scan cells (FF1, FF2, FF5, and FF6) that are not within the removed logic block E1. Provide a control signal that controls a switch means such as a multiplexer for selecting either of these two signals. During ASIC level test vector generation and ASIC level testing performed by the customer, select the non-concatenated scan chain to scan out. During this phase, the scan cells within removed block E1 will not affect the expected output vectors.

During vector generation performed in-house by the vendor, and corresponding core level testing performed by the customer using the vectors supplied by the vendor, the control will be set to the opposite value. This allows the concatenated chain to be read out, so that the circuitry within block E1 can be tested.

The result of the above circuit and method is that any need to provide to the customer details about logic block E1 including the number of scan cells within E1, or alternatively to manually edit the ASIC level test vector output file in multiple places, is avoided.

Figure 11:
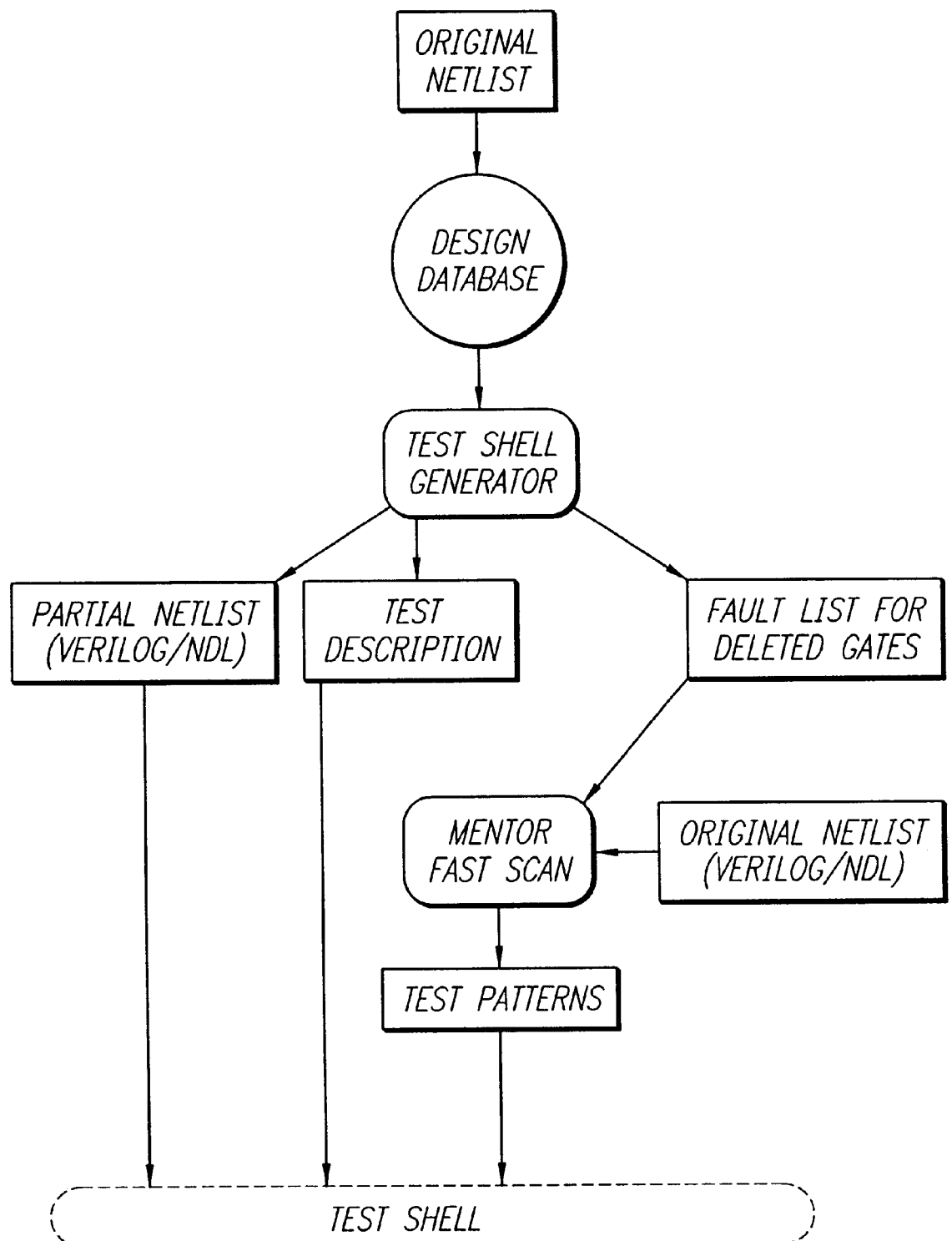
FIG. 11 is a functional overview of a Test Shell Generator tool.

FIG. 11 shows the functional overview of the Test Shell Generator software tool. The main function of the Test Shell Generator is to prune the original netlist of the core by removing certain gates that are not necessary for ASIC test vector generation, and produce a partial (reduced) netlist. During the ASIC test vector generation process, the customer will generate test vectors to detect faults in that part of the core that is specified by the partial netlist (of the core) supplied to the customer.

The vendor will supply the customer with a set of test vectors to detect faults in that part of the core that has been removed from the original netlist. In order to generate these test vectors, the Test Shell Generator first generates a fault list covering the gates that have been removed from the original netlist. The vendor uses this fault list to generate the necessary test vectors. The test shell to be delivered to the customer for this core comprises these test vectors, along with the reduced partial netlist for the core. The customer will then generate additional test vectors for ASIC level testing.

The method of the present invention was applied to several cores as well as several existing complete ASIC designs, in order to measure the effectiveness of the invention. The results are presented in Table 1 below.

TABLE 1

| Circuit | No. of Internal Cells | Gate Reduction | |
|---|---|---|---|
| | | No. of Gates Removed | % of Gates Removed |
| ASIC #1 | 18569 | 6181 | 33.29 |
| ASIC #2 | 11371 | 6311 | 55.50 |
| ASIC #3 | 9309 | 26 | 0.28 |

TABLE 1-continued

| Circuit | No. of Internal Cells | Gate Reduction | |
|---|---|---|---|
| | | No. of Gates Removed | % of Gates Removed |
| ASIC #4 | 1802 | 180 | 10.00 |
| Communications Core #1 | 1602 | 96 | 6.00 |
| Communications Core #2 | 570 | 36 | 6.42 |
| m10t | 365 | 237 | 64.93 |
| Processor Core #1 | 4808 | 2678 | 55.70 |
| Processor Core #2 | 2627 | 1 | 0.04 |
| Processor Core #3 | 468 | 2 | 0.43 |
| Total of Processor Cores 1–3 | 7907 | 2681 | 33.91 |

As indicated in Table 1, results for the test cases varied from 0.04% reduction to 64.93% reduction. Even a very small percentage of gate reduction can be of great value to an ASIC vendor, because eliminating even a very small portion of the circuit from the netlist will prevent wholesale, automated copying of the proprietary core design from the netlist. The engineering effort to determine what functional sections of the core are and are not present within the reduced netlist, and design the missing sections to seamlessly operate with the rest of the core, may in many circumstances be sufficient to discourage copying altogether. Furthermore, a core designer who is aware of the netlist reduction method presented herein can create his or her design with an eye toward ensuring that the most competitively sensitive portions of the design will be removable by the present method. That is, the core designer can identify competitively sensitive portions of the core design that would not otherwise be testable via a test port, and provide to those competitively sensitive portions a capability to be tested via the test port, whereby the competitively sensitive portions can be removed from the test shell by the method of the present invention and thus maintained as proprietary design information.

Although the above discussion focusses on a digital ASIC, the same techniques may be used for digital logic blocks within a mixed signal ASIC. The general methodology may also be applied to a purely analog ASIC. Using isolating means such as analog switches, some proprietary processing portion of an analog core may be isolate from the other portion, and tested via a separate test port using test input signals and expected output signals supplied by the vendor. This eliminates any need to supply a detailed netlist description such as a SPICE model of the isolated portion to the customer. For an analog ASIC, individual proprietary processing portions would in most cases not be connected serially as with a digital scan chain, but would be output to ASIC test I/O pins individually either by multiplexing or providing a separate test port for each proprietary portion to be isolated and tested.

Although the present invention has thus been described in detail with regard to the preferred embodiments and drawings thereof, it should be apparent to those skilled in the art that various adaptations and modifications of the present invention may be accomplished without departing from the spirit and the scope of the invention. Accordingly, it is to be understood that the detailed description and the accompanying drawings as set forth hereinabove are not intended to limit the breadth of the present invention, which should be inferred only from the following claims and their appropriately construed legal equivalents.

What is claimed is:

1. A method of generating a reduced netlist for a digital logic block for the purpose of maintaining certain implementation details of the digital logic block confidential while allowing test patterns for the digital logic block to be generated from the reduced netlist, the test patterns being sufficient in combination with predetermined supplemental test patterns to test substantially all of the digital logic block, the digital logic block including primary inputs, primary outputs, logic gates, and signal connections therebetween, the method comprising the steps of:

identifying a first logic group comprising gates that are not in the input cone of the primary outputs, are not in the output cone of the primary inputs, and are not in the input cone of the output cone of the primary inputs;

identifying a second logic group comprising gates that may be tested in isolation from said first logic group; and generating a reduced netlist, the reduced netlist containing netlist information for said second logic group, said netlist containing less than complete netlist information for said first logic group.

2. An integrated circuit comprising:

a processing circuitry comprising:
  a first processing portion comprising proprietary circuitry; and
  a second processing portion comprising non-proprietary circuitry, said second processing portion being in functional communication with said first processing portion during a normal operating mode;

a functional I/O port comprising functional input nodes for presenting input signals to said processing circuitry and functional output nodes for conveying output signals from said processing circuitry;

a test port for testing said processing circuitry in a test mode; and isolation means for isolating said first processing portion from said second processing portion, such that said first processing portion may be substantially completely tested via said test port and said second processing portion may be substantially completely tested via said functional I/O port and said test port.

3. The integrated circuit of claim 2 wherein said first and second processing portions each comprise digital combinatorial and sequential logic.

4. A system for testing an integrated circuit comprising:

an integrated circuit as defined in claim 2;

a netlist description of said second processing portion of said processing circuit, the netlist description for generating test vectors to test said second processing portion using said functional I/O port; and a set of test patterns for testing said first processing portion using said test port.

5. A circuit for keeping confidential certain implementation details of a logic block, the circuit including scan cells for test purposes, the circuit comprising:

A first logic portion, said first logic portion including a first set of scan cells, the number of scan cells within said first set not being considered proprietary information;

a second logic portion, said second logic portion including a second set of scan cells, the number of scan cells within said second set being considered proprietary information;

a first scan chain including said first set of scan cells;

a second scan chain including said second set of scan cells; and a switch for selectively coupling a test output port to either said first scan chain in a first test mode, or to said first scan chain concatenated with said second scan chain in a second test mode.

6. A circuit as defined in claim 5 wherein:

said switch comprises a multiplexer.

7. A method of keeping electronic core circuit design details confidential from an outside party such as a user of said core, while still allowing said outside party to substantially fully test an integrated circuit design incorporating said core, the method comprising the steps of:

(a) identifying a proprietary portion of said core that is competitively sensitive and that can be substantially fully tested via a test port;

(b) generating a test shell for the core, said test shell comprising less than complete netlist information for said proprietary portion, said test shell otherwise representing a netlist of said core;

(c) generating test port test vectors to test said proprietary portion via said test port; and (d) providing to said second party said test shell and said test port test vectors;

whereby said second party is able to substantially fully test a design incorporating said core even though said second party has been provided with less than complete core netlist information.

8. The method of claim 6 further comprising the steps of:

(e) identifying competitively sensitive portions of said core design that are not testable via said test port; and (f) providing to said competitively sensitive portions a capability to be tested via said test port;

whereby said competitively sensitive portions can be removed from said test shell and maintained as proprietary design information.

* * * * *